US010047456B2

(12) United States Patent
Halasyamani et al.

(10) Patent No.: US 10,047,456 B2
(45) Date of Patent: Aug. 14, 2018

(54) METHOD OF PRODUCING A MONOLITHIC CRYSTAL BY TOP-SEEDED SOLUTION GROWTH FROM A LIQUID CRYSTAL FLUX COMPRISING A MIXTURE OF SOLID PRECURSORS (71) Applicant: University of Houston System, Houston, TX (US)

(72) Inventors: P. Shiv Halasyamani, Houston, TX (US); Weiguo Zhang, Houston, TX (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 322 days.

(21) Appl. No.: 14/717,970

(22) Filed: May 20, 2015

(65) Prior Publication Data

US 2015/0252490 A1    Sep. 10, 2015

Related U.S. Application Data (62) Division of application No. 13/668,913, filed on Nov. 5, 2012, now abandoned.

(Continued)

(51) Int. Cl.
*C30B 15/36* (2006.01)
*C30B 9/06* (2006.01)
(Continued)

(52) U.S. Cl.
CPC .............. *C30B 9/06* (2013.01); *C30B 11/003* (2013.01); *C30B 15/00* (2013.01); *C30B 17/00* (2013.01);
(Continued)

(58) Field of Classification Search
CPC .... C30B 9/00; C30B 9/04; C30B 9/06; C30B 11/00; C30B 11/003; C30B 15/00;
(Continued)

(56) References Cited

U.S. PATENT DOCUMENTS 4,019,950 A * 4/1977 Croxall .................. C01G 21/14
117/71
4,761,202 A * 8/1988 Bordui ...................... C30B 9/00
117/3

(Continued)

FOREIGN PATENT DOCUMENTS

CN    101089241 A    12/2007
JP     11106284 A     4/1999

OTHER PUBLICATIONS

PCT/US2012/063563 International Search Report and Written Opinion dated Mar. 15, 2013 (12 p.).

(Continued)

*Primary Examiner* — Kenneth A Bratland, Jr.
(74) *Attorney, Agent, or Firm* — Conley Rose, P.C.

(57) ABSTRACT

A monolithic crystal having the atomic formula $W_nX_mY_pZ_r$, with at least one dimension greater than about 10 mm. A method for top seed, solution growth of a monolithic crystal, wherein the method includes the steps of: preparing a precursor, forming a seed crystal, and forming the monolithic crystal. Some configurations of the method include the differential control of the crystal flux temperature in a furnace and the rotational frequency of a seed crystal in the crystal flux.

15 Claims, 10 Drawing Sheets

Related U.S. Application Data (60) Provisional application No. 61/555,776, filed on Nov. 4, 2011.

(51) Int. Cl.

| | | |
|---|---|---|
| *C30B 15/00* | (2006.01) | |
| *C30B 17/00* | (2006.01) | |
| *C30B 29/22* | (2006.01) | |
| *C30B 11/00* | (2006.01) | |
| *C30B 29/10* | (2006.01) | |
| *H01M 4/58* | (2010.01) | |
| *C30B 29/30* | (2006.01) | |

(52) U.S. Cl.
CPC .............. *C30B 29/10* (2013.01); *C30B 29/22* (2013.01); *C30B 29/30* (2013.01); *H01M 4/5825* (2013.01)

(58) Field of Classification Search
CPC ......... C30B 15/36; C30B 17/00; C30B 29/00; C30B 29/10; C30B 29/22; C30B 29/30; H01M 4/5827
USPC ............ 117/11, 13, 19, 35–36, 41, 937, 944
See application file for complete search history.

(56) References Cited

U.S. PATENT DOCUMENTS

| | | | |
|---|---|---|---|
| 5,219,833 A | 6/1993 | Gopalakrishnan et al. | |
| 5,343,827 A | 9/1994 | Bordui et al. | |
| 2005/0190805 A1* | 9/2005 | Scripsick | .............. H01S 3/0941 372/41 |
| 2005/0196334 A1 | 9/2005 | Saidi et al. | |
| 2007/0259271 A1* | 11/2007 | Nanno | ................ H01M 2/0267 429/318 |
| 2009/0286155 A1 | 11/2009 | Takehara | |
| 2011/0098643 A1 | 4/2011 | Chiang et al. | |
| 2011/0170174 A1 | 7/2011 | Chen et al. | |

OTHER PUBLICATIONS

Eder, R.J.P., et al., "Seed Loading Effects on the Mean Crystal Size of Acetylsalicylic Acid in a Continuous-Flow Cyrstallization Device." Cryst. Res. Technol. 46, No. 3, Feb. 2011, pp. 227-237 (11 p.).

Reddy, E. Sudhakar, et al., "The Effect of Size, Morphology and Crystallinity of Seed Crystals on the Nucleation and Growth of Y—Ba—Cu—O Single-Grain Superconductors," Superconductor Science and Technology No. 18 (2005), pp. 64-72 (10 p.).

Amin, Ruhul, et al., "Anisotropy of Electronic and Ionic Transport in LiFePO4 Single Crystals," Electrochemical and Solid-State Letters (2007), vol. 10, No. 1 (1 p.).

Office Action dated Mar. 28, 2014 for U.S. Appl. No. 13/668,913 (10 p.).

Response to Office Action Dated Mar. 28, 2014 for U.S. Appl. No. 13/668,913; Response filed Jul. 24, 2014 (12 p.).

Final Office Action dated Nov. 20, 2014 for U.S. Appl. No. 13/668,913 (22 p.).

Response to Final Office Action Dated Nov. 20, 2014 for U.S. Appl. No. 13/668,913; Response filed Feb. 20, 2015 (15 p.).

Advisory Action dated May 20, 2015 for U.S. Appl. No. 13/668,913 (9 p.).

* cited by examiner

METHOD OF PRODUCING A MONOLITHIC CRYSTAL BY TOP-SEEDED SOLUTION GROWTH FROM A LIQUID CRYSTAL FLUX COMPRISING A MIXTURE OF SOLID PRECURSORS

CROSS-REFERENCE TO RELATED APPLICATIONS

This application is a divisional of U.S. application Ser. No. 13/668,913 filed Nov. 5, 2012, and entitled "System and Method for Monolithic Crystal Growth," which claims priority to U.S. Provisional Patent Application No. 61/555,776 filed on Nov. 4, 2011 and entitled "Method for Crystal Growth" incorporated herein by reference in its entirety.

STATEMENT REGARDING FEDERALLY SPONSORED RESEARCH OR DEVELOPMENT

Not applicable.

BACKGROUND OF THE DISCLOSURE

Field of the Disclosure

The present disclosure is directed to methods for making monolithic polar crystals and more specifically to top-seed solution growing polar, noncentrosymmetric crystals.

Background

There is a demand for rechargeable batteries with properties that include compact size, high-energy density, environmentally friendly materials, and at a lower cost relative to the current batteries. These demands have contributed to the development of lithium-ion batteries and lithium-ion technologies. Generally, a lithium-ion battery contains an anode, an electrolyte solution (the separator), and a cathode. The anode, or negative electrode, in a lithium-ion battery is conventionally composed of graphite coated on a copper foil. Graphite is a highly conductive and layered material used as the active material in the anode because it can reversibly intercalate lithium ions between its layers. The separator has the role of separating the cathode from the anode. In the charging cycle the positively charged lithium ions move from the cathode to the anode, through the separator via an electrolyte solution. Likewise during the battery discharge process the lithium ions migrate in the opposite direction from the anode to the cathode passing through the separator. Within the battery industry, the lithium-ion battery anodes and electrolyte solutions are considered established and optimized technologies, thus continued development has shifted to other battery components.

More specifically, the lithium containing material in the anode is the focus of industrial research and development. As such, a number of lithium anode materials have been developed and implemented in batteries, including $LiCoO_2$, $LiMn_2O_4$, and $LiFePO_4$. However, these materials are implemented as micron-sized particulates, grains, or powders, and the lithium cation ($Li^+$) $Li^+$ leaves the powder in order to provide the ion migration between the anode and the cathode. The particulates inherently include grain boundaries that limit ion migration, increase the voltages necessary for ion migration, and decrease the ion densities in the battery. Thus, there is an increased demand for anodic materials with increased particulate size and ion density with decreased grain boundary ion limitations and decreased voltage requirements. Thus, the present disclosure relates to macroscopic ionic materials.

BRIEF DESCRIPTION OF THE DRAWINGS

The disclosure can be better understood with reference to the following detailed description together with the illustrative drawings of various embodiments.

DETAILED DESCRIPTION

Overview.

Generally, the present disclosure compromises a method for the preparation of macroscopic, single crystal, cathode materials. Without limitation by any particular theory, a macroscopic, single crystal, cathodic material, or a monolithic crystal as used hereinafter, has at least one dimension that is larger than about 10 mm (i.e. 1 cm). Also, a monolithic crystal inherently comprises a reduced number of grain boundaries relative to particulate crystals as utilized in lithium ion battery cathodes. In certain instances, monolithic crystals are configurable to increase the lithium ion capacity of batteries by at least an order of magnitude; alternatively, at least 10-fold; and in certain configurations potentially increase the lithium ion capacity by at least a factor of 100.

In general, there is a plurality of methods to grow monolithic crystals. Exemplary methods include the Bridgeman-method, the Czochralski-method, and the image-furnace method. It should be noted that these methods typically require specialized and expensive equipment, manufacturing facilities, and capital investments. In comparison, the present disclosure relates to top-seeded solution growth, hereinafter TSSG, which offers a low-cost method to grow large single crystals. Additionally, the present disclosure relates to methods of controlling the properties of formation such as time, temperature, melt composition, cooling rate, and quality of seed crystal during a TSSG process. Also, the present disclosure relates to methods of optimizing these properties in order to form a monolithic crystal having sufficient qualities as described hereinafter for implementation in a lithium ion battery apparatus.

System.

Figure 1:
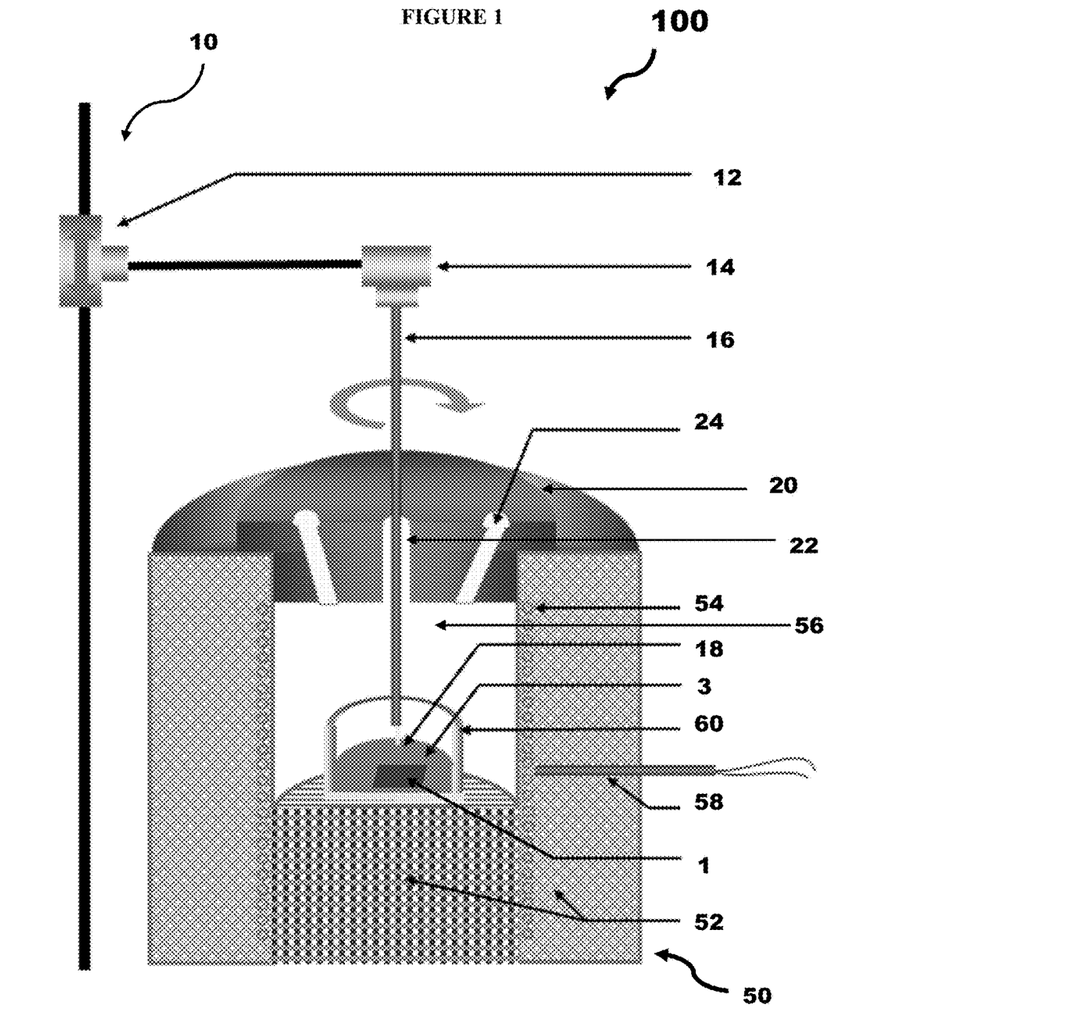
FIG. 1. illustrates a schematic diagram of the top-seeded solution growth system for monolithic crystals.

Referring now to FIG. 1, there is illustrated an exemplary TSSG system 100 according to the present disclosure. Generally, the TSSG system 100 comprises a seed system 10 and a reactor system 50. The seed system 10 is configured for incrementally inserting a rotatable seed rod, retaining a crystal seed into the reactor system 50. The reactor system 50 is configured for controlling the properties to facilitate the initiation of crystal formation and the growth therefrom. In certain configurations, the TSSG system 100 may be autonomously controlled, for example by a computer processor or computer processing system executing instructions from a memory.

The seed system comprises a vertical motor 12, a rotational motor 14, and a seed rod 16. The seed rod 16 is configured to reversibly retain a crystal seed 18. In certain configurations the seed system 10 further comprises the reactor top 20 having a seed rod passage 22 therethrough and a visual observation port 24.

The reactor system 50 comprises a furnace including an insulator 52 having a heating coil 54 disposed therein and wherein both surround a reaction chamber 56. The heating coil 54 is coupled to a heating element or a thermocouple 58 for altering temperature in the reaction chamber 56. The reaction chamber 56 is retains a crucible 60. The crucible 60 is a dish or bowl for retaining the crystal 1 and the flux 3.

More specifically, in operation the reactor top 20 is removed from reactor system 50 such that a crucible 60 containing powder or a flux 3 is positioned in the reaction chamber 56. The reactor top 20 is reversibly sealed to the reaction system 50. The vertical motor 12 is configured to insert and retract the seed rod 16 from the reactor chamber 56 via the passage 22. The seed rod 22 includes the crystal seed 18 for contacting the flux 3. Likewise, rotation motor 14 is coupled to vertical motor 12 and configured to rotate the seed rod 16 in the passage 22 and the reactor chamber 56 such that the crystal seed 18 rotates within the flux 3. Further, the thermocouple 58 is configured to sense and adjust the temperature of the heating coil 54 and the reactor chamber 56 in order to control and maintain a predetermined temperature. Alternatively, the thermocouple 58 is configured to sense and control the heating coil 54 in response to the temperature of a crucible 60 or the flux 3 therein, within the reaction chamber 56. In alternative configurations, the thermocouple 58 is in communication with a computer or computer processor for autonomous control of the heating coil 54. Without limitation by theory, alternate configurations may be operated in accordance with the present method.

Method:

Generally, the present disclosure is related to the method for growing monolithic crystals. In various embodiments according to the disclosure the monolithic crystals comprise a general atomic formula:

$$W_n X_m Y_p Z_r \quad \text{[Equation 1.]}$$

wherein, W may comprise at least one chosen from Li, Na, K, Rb, Cs, Mg, Ca, Sr, or Ba; X may comprise at least one chosen from Fe, Ti, V, Cr, Mn, Co, Ni, Cu, Zn, Zr, Nb, Mo, Pd, Ag, Cd, Hf, Ta, W, Pt, Au, or Hg; and wherein Y comprises at least one chosen from P, Al, Si, S, Ga, Ge, As, Se, In, Sn, Sb, Te, I, Tl, Pb, or Bi. Generally Z comprises oxygen. In certain instances, the Z as used herein may comprise any oxygen containing functional group, such as but not limited to alcohols, ketones, aldehydes, carbonates, esters, and other oxides. In additional configurations, Z comprises at least one halogen or chalcogen chosen from O, F, Cl, or Br. Further, the subscript n, m, p, and r for W, X, Y and Z respectively may be any integer including zero up to about one hundred without limitation. With respect to Z, the value of r may be a multiple of 7, in certain applications. Also, with respect to Y, in some applications the value of p is zero. In certain configurations, the monolithic crystals comprise diphosphates and in additional configuration, the monolithic crystals comprise inorganic salts. Further, in some configurations described herein, the monolithic crystals comprise lithium salts, such as lithium-diphosphate salts. In an exemplary embodiment of the present method, the monolithic crystals comprise $LiFeP_2O_7$ and in another exemplary embodiment, the monolithic crystals comprise $K_3V_5O_{14}$.

Figure 2:
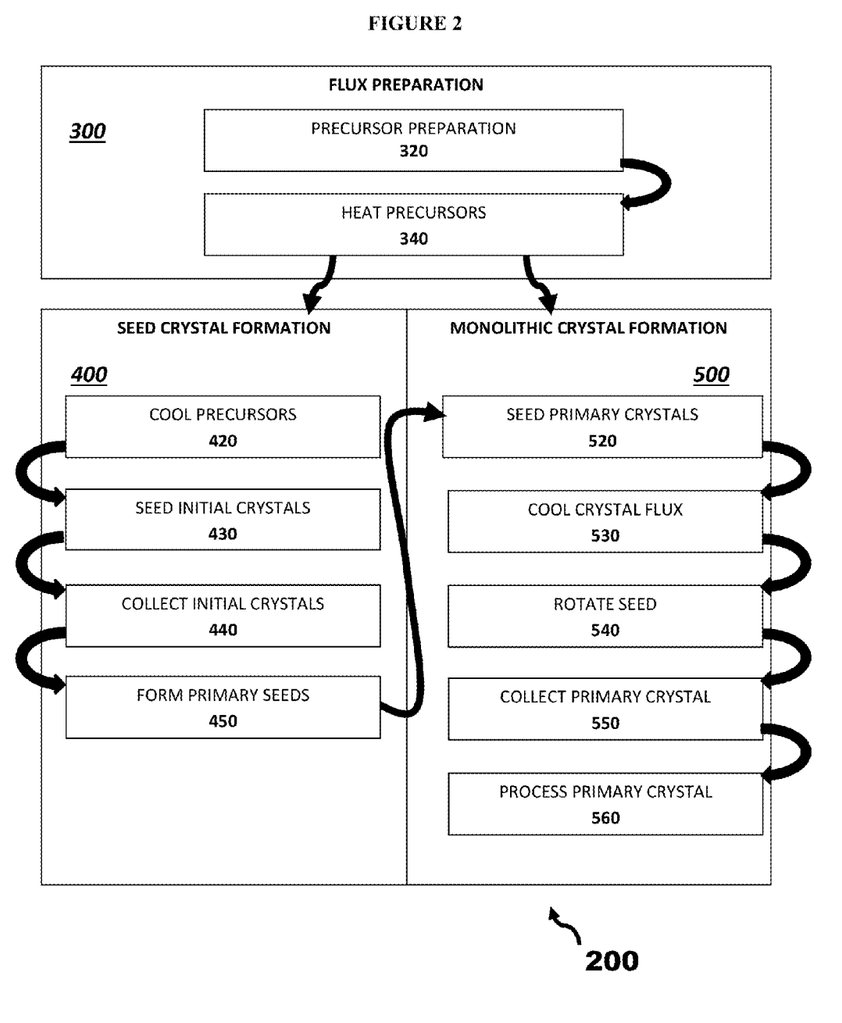
FIG. 2. illustrates a schematic of the method for growing monolithic crystals.

Referring now to FIG. 2, the method 200 comprises three portions or modules comprising preparing a crystal flux 300, forming seed crystals 400, and forming monolithic crystals 500. Without limitation the module for preparing the crystal flux 300 comprises the steps of preparing precursors 320 and heating the precursors 340. Further, the module for forming seed crystals 400 comprises cooling the precursors 420, seeding the initial crystals 430, collecting the initial crystals 440, and forming the primary seed crystals 460. In some configurations, the steps in forming the seed crystals 400 may be repeated as needed to seed and collect the seed crystals. The module for forming the monolithic crystals 500 comprises seeding the primary crystals 520, cooling the precursors 530, rotating the seeded crystal 540, and collecting the primary crystal 550. Further, in some configurations, forming the monolithic crystal 500 may comprise the step of processing the primary crystal 560. Generally, the flux preparing module 300 provides the flux or the precursors for the seed crystals and the monolithic crystals, in solution.

Crystal Flux Preparation.

The flux preparing module 300 comprises the steps of preparing the precursors 320 and heating the precursors 340. More specifically, preparing the precursor comprises 320 mixing stoichiometric amounts of inorganic salts. The solid inorganic salts may be in any stoichiometric ratio among any number of precursors. In certain instance, preparing the precursors 320 comprises preparing less than about 10 precursors; alternatively, less than about 5 precursors; and in certain configurations less than about 3 precursors of solid inorganic salts are used. Mixing the solid inorganic salts comprises mechanically reducing the solid inorganic salts to form particulates. The step or steps of utilized to produce particulates may be any method without limitation, for example grinding under pressure via a mortar and pestle. Additionally, mixing the inorganic salts by grinding may be conducted for a predetermined period to ensure complete mixture and mechanical reduction in the size of the solids. Exemplary periods may be between about 1 minute and about 60 minutes; alternatively, between about 1 minute and 30 minutes; and in exemplary embodiments between about 5 minutes and about 15 minutes. In some configurations of the flux preparing module 300, mixing the stoichiometric quantities of the solid, inorganic salts comprises mechanically reducing the solids for at least 5 minutes.

Heating the precursors 340 comprises placing the mechanically reduced, solid, inorganic salts in a suitable container and placing the container in a furnace. A suitable container is inert or unreactive with respect to the inorganic salts and configured to withstand temperatures in excess of 1200° C. A suitable container may comprise a crucible comprising platinum or ceramic compositions without limitation. Heating the precursors 340 comprises at temperature of at least about 750° C. and in some configurations at least about 1040° C. Additionally, heating the precursors 340 comprises a period of between about 1 hour and about 40 hours; alternatively between about 5 hours and about 25 hours; and in certain exemplary configurations between about 9 hours and about 11 hours.

The flux preparing module 300 of the disclosed method may further comprise repeating the steps of preparing the precursors 320 and heating the precursors 340 for a plurality of cycles. In alternative configurations, preparing the precursors 320 may further comprise analyzing the precursors for impurities. Analyzing the precursors may comprise any method without limitation, for example X-ray diffraction of the mechanically reduced, solid, inorganic salts. Further, the flux preparing module 300 comprises repeating the steps of preparing the precursors 320 and heating the precursors 340 until analysis of the precursors indicated the precursors are substantially free of impurities and in certain configurations, until the precursors are completely free of impurities.

Further, heating the precursors 340 comprises melting the precursors to form a liquid flux. More specifically, heating the precursors 340 comprises mixing the precursors with additional inorganic components and melting them in the container, in the furnace to form a liquid crystal flux. In the present configuration, heating the precursors 340 to form a liquid crystal flux comprises heating them to a temperature of at least about 1040° C. and alternatively, heating the precursors to a temperature of at least about 1050° C. In certain configurations, heating the precursors 340 comprises heating the precursors to a temperature above the melting point of the precursors. Heating the precursors 340 to for a liquid crystal flux further comprises visual confirmation that the precursors are liquid. Without limitation by theory, vision confirmation comprises verifying that there are no crystalline portions of the mechanically reduced, solid, inorganic salts visible in the flux and at the surface thereof, in some configurations of preparing the flux 300.

In a non-limiting exemplary embodiment of the present disclosure, the flux preparing module 300 for the production of monolithic polycrystalline $LiFeP_2O_7$ may proceed according to the following steps: mixing stoichiometric amounts of the precursors comprising $LiH_2PO_4$, $NH_4H_2PO_4$ and $Fe_2O_3$ by mechanical reduction via agate mortar and pestle for between about 5 and about 15 minutes to produce a particulate mixture. Placing the particulate mixture in a platinum crucible in a furnace, and heating the mixture to about 750° C. for about 10 hours. In some exemplary embodiments for producing monolithic polycrystalline $LiFeP_2O_7$ the mixture may be cooled in the furnace to about room temperature, such as but not limited to about 25° C. Subsequent regrinding and reheating of the precursor mixture may be repeated a plurality of times. In certain instances, the after cooling the purity of the mixture may be analyzed by powder X-ray diffraction to ensure the mixture is substantially free of impurities. In further exemplary instances, reheating the mixture may comprise heating it in a furnace for about 20 hours. Still further, the regrinding and reheating steps may be repeated until an X-ray diffraction demonstrating that the mixture is completely free of impurities. Subsequently, the particulate mixture of the precursors, polycrystalline $LiFeP_2O_7$ is mixed with additional compositions comprising $LiH_2PO_4$ and $NH_4H_2PO_4$. In exemplary embodiments, the precursors are mixed at a molar ratio 1 mole of $LiFeP_2O_7$ to between about 0.01 mole and about 0.5 mole of $LiH_2PO_4$ to between about 0.05 mole and 0.5 mole of $NH_4H_2PO_4$ and heating the mixture in a vertical furnace, in air. The mixture is slowly heated to a temperature of about 1050° C. for several hours or until a homogeneous melt is obtained, as determined by visual inspection that verifies there are no visible solids or crystals at the surface of the melt or the flux.

Seed Crystal Preparation.

The forming seed crystal module 400 comprises preparing the seed crystals for the forming the monolithic seed crystal module 500. The forming seed crystal module 400 comprises the steps of cooling the precursors 420, seeding the initial crystals 430, collecting the initial crystals 440, and forming the primary seed crystals 450. In certain instances, forming the primary seed crystals 450 comprises final preparation of the seed crystals for forming the monolithic crystal module 500.

Cooling the precursors 420 comprises lowering the temperature in the furnace to below the predetermined critical temperature of the precursor, for example the melting temperature of the precursors. Alternatively, the critical temperature as used herein may be considered the saturation temperature of the precursor. Also, the temperature is lowered slightly or just below the critical point of the precursors. In instances, the temperature in the furnace is lowered to between about 40° C. and about 10° C. below the critical temperature of the precursors; alternatively, between about 30° C. and about 20° C. In certain instances, the temperature is lowered to between about 1010° C. and about 1030° C.; alternatively the temperature is lowered to about 1020° C.

Seeding the initial crystals 430 may comprise inserting another crystal into the flux or inserting a structure or object that a crystal may nucleate, initiate, or otherwise bind onto and grow thereon. In instances, seeding the initial crystals 430 may comprise inserting a metallic object or seed rod into the crystal flux. In certain instances, seeding the initial crystals 430 may comprise inserting a seed rod including a wire comprising a transition metal into the crystal flux, and in non-limiting exemplary configurations, seeding the initial crystals comprises dipping a wire comprising a Group VIII transition metal, such as platinum, into the melted crystal flux. Also, seeding the initial crystals 430 may comprise durations between about 12 hours and about 72 hours; alternatively between about 36 hours and about 60 hours; and in certain configurations, seeding the initial crystals 430 comprises inserting the object into the melt at temperature slightly below melting temperature for about 48 hrs.

Collecting the initial crystals 440 during forming the seed crystal module 400 comprises removing the seeding material from the flux and removing the crystalline material therefrom. In instances, collecting the initial crystals 440 comprises altering the initial crystals. In certain instances, collecting the initial crystals 440 comprises cutting the crystals to reveal predetermined crystal faces. Still further, after collecting the initial crystals 440 and altering the initial crystals, the initial crystals may be reinserted into the flux. Reinserting the initial crystals into the flux comprises growing the initial crystals until they reach a predetermined size. In certain instances, collecting the initial crystals 440 comprises growing the initial crystals on the seeding material until they have at least one dimension that is at least 1 millimeter; alternatively, at least one dimension that is at least 5 millimeters; and in certain instances, until at least one dimension is at least 10 millimeters.

Forming primary seed crystals 450 comprises further altering and analyzing the initial crystals. In instances, further altering the initial crystals comprises cutting the faces of the initial crystals. In certain instances, the initial crystals including the altered or cut faces may be utilized for additionally rounds of seeding initial crystals 430. Alternatively, forming primary seed crystals 450 comprises analyzing the initial crystals. In instances, analyzing the initial crystals comprises identifying crystals having predetermined or preferred structure. In certain instances, forming primary seed crystals 450 comprises conducting X-ray diffraction or other analysis without limitation. Further, the predetermined or preferred structure may comprise a dimension, a crystal-axis, a crystal-structure, a clarity-determination, or combinations thereof. Forming primary seed crystals 450 comprises forming seed crystals having well defined edges, faces, and crystal axes, without limitation.

In a non-limiting exemplary embodiment of the present disclosure, the flux comprising $LiFeP_2O_7$, $LiH_2PO_4$ and $NH_4H_2PO_4$ is cooled to about 1020° C. Seeding the initial crystals comprises dipping a platinum wire into the crystal flux and collecting crystals that spontaneously crystallized on the platinum wire after two days. Subsequently, these crystals are cut according to predetermined or preferred orientations in order to grow about 1 millimeter to about 5 millimeter sized, seed crystals. In some configurations of the present method the cut seed crystals are further altered in order expose the highest quality faces and edges. Subsequently, repeating the steps of seeding further crystals using these selected parts to grow larger seed crystals, and cutting these larger crystals to expose the highest quality faces and edges are conducted until seed crystals of about 1 cm in length are formed. Generally, the seed crystals are formed over 4 days and demonstrate high quality faces and edges. Additionally, upon analysis forming the seed crystals comprises forming crystals having a crystalline b-axis oriented as determined by powder X-ray diffraction.

Monolithic Crystal Formation.

The forming a monolithic crystal module 500 according to the present method 200 of the disclosure comprises seeding the primary crystals 520 in the flux, cooling the crystal flux 530, rotating the seed 540 in the flux, and collecting the primary crystal 550. Processing the primary crystal 560 forms the monolithic crystal for applications as described herein. In certain instances, forming the monolithic crystal module 500 is similar or analogous to the seed crystal forming module 400 discussed herein above. Generally, the former module comprises forming a seed crystal, such that when the method initiates forming the monolithic crystal module 500, there is a minimum of post-formation processing 560.

Seeding the primary crystals 520 comprises utilizing at least one seed crystal from seeding the crystal formation module 400. Without limitation by theory, seeding the primary crystals 520 comprises inserting the seed crystal into the flux retained on or coupled to a structure or object such that a crystal may nucleate, initiate, or otherwise bind onto and grow thereon. In instances, the seed rod may comprise inserting a metallic object into the crystal flux, the metal object configured to retain the seed crystal. In certain instances, seeding the primary crystals 520 may comprise inserting a seed rod including a wire comprising a transition metal into the crystal flux, wherein the seed rod and wire retain a seed crystal. In non-limiting exemplary configurations, seeding the primary crystals comprises dipping a wire comprising a Group VIII transition metal, such as platinum, into the melted crystal flux, wherein the wire retains a seed crystal.

Cooling the crystal flux 530 comprises reducing the flux temperature to below the critical temperature of the seed crystal and the crystal flux. Also, the temperature is lowered slightly or just below the critical temperature of the seed crystal and the crystal flux, for instance the saturation temperature or the melting temperature. In instances, the temperature in the furnace is lowered from about 1° C. to about 20° C. above the critical temperature to between about 50° C. and about 10° C. below the critical temperature of the seed crystal and the crystal flux; alternatively, between about 30° C. and about 20° C. below the critical temperature of the seed crystal and the crystal flux. In certain instances, the temperature is lowered from about 1050° C. to between about 1010° C. and about 1030° C.; alternatively the temperature is lowered to about 1020° C. In further instances of the forming the monolithic crystal module 500, the temperature may be fluctuated between about 10° C. above the critical temperature and about 10° C. below the critical temperature.

Rotating the seed crystal 540 comprises rotating the seed rod, the wire or seed retaining object, and the seed in contact with the flux. Generally, rotating the seed crystal 540 may be concurrent with seeding the primary crystals 520 and cooling the crystal flux 530. Still further, the rotating the seed crystal 540 may be continued throughout the forming the monolithic crystal module 500. In instances, rotating the seed crystal 540 comprises a rotational frequency between about 2 revolutions per minute and about 25 revolutions per minute; alternatively between about 6 revolutions per minute and about 18 revolutions per minute and in certain instances, between about 8 revolutions per minute and about 12 revolutions per minute. In further configurations, rotating the seed crystal 540 at difference frequencies may provide a means to control the shape or morphology of the primary crystal growth.

Collecting the primary crystal 550 comprises removing the crystal from the melt. In instances, collecting the primary crystal 550 is similar or analogous to collecting the initial crystals 440 in forming the seed crystal module 400 of the present method 200. Generally, collecting the primary crystal 550 comprises controlling the temperature of the crystal flux for a period of at least about 2 days; alternatively, for at least about 3 days; and in some instances for at least about 5 days. Still further, collecting the primary crystal 550 may comprise growing a crystal to at least about 5 mm in one dimension by controlling the critical temperature of the crystal flux and alternatively growing a crystal of at least about 10 mm in one dimension. Additionally, collecting the primary crystals 550 may comprise reinserting the crystals into the flux until they reach the predetermined size. Further, collecting the primary crystal 550 may comprise seeding the primary crystal 520 to reinitiate the forming of a monolithic crystal module 500.

Without limitation by theory, collecting the primary crystals 550 may be sufficient for certain applications. However, in alternative applications, processing the primary crystals 560 in order to form a monolithic crystal may be utilized. Generally, processing the primary crystals 560 comprises any step of mechanical or chemical altering of the monolithic crystal. In instances, the primary crystals may be cut or fractured along particular crystal planes in order to form a monolithic crystal for a predetermined application. Alternative, the faces of the primary crystal may be polished or buffed in order to prepare a monolithic crystal for another application.

Referring again to a non-limiting exemplary embodiment of the present disclosure, the monolithic crystal forming module comprises placing at least one selected seed crystal on a clean platinum wire, coupled to the seed rod, and inserting or dipping the platinum wire into the melt of the crystal flux. Additionally, concurrently with or immediately sequential to inserting the seed crystal, the seed rod and the platinum wire are rotated. In certain embodiments of this example, the seed rod and crystal are rotated at a revolutionary frequency of about 10 revolutions per minute. Additionally, the temperature may be held at 1050° C., which corresponds to about 10° C. above the critical temperature during the insertion and rotation steps. Alternatively, cooling the melt or the crystal flux to about the critical temperature, in this example 1040° C., immediately upon dipping the seed crystal into the melt and maintaining the saturation temperature for about 15 minutes. Further, cooling the crystal flux comprises cooling the temperature and allowing the primary crystal to grow to over 10 millimeters in at least one dimension over period of about 4 to about 5 days. The single primary crystal is removed from the crystal flux, while another seed crystal is inserted into the crystal flux. Further, in certain instances, the crystal flux is reheated. Generally, in the exemplary embodiment for growing a monolithic crystal of $LiFeP_2O_7$, the temperature and the composition of the crystal flux is carefully controlled to maintain a homogeneous melt.

Alternatives.

While the disclosure described herein refers to exemplary methods for making monolithic crystals of $LiFeP_2O_7$, one of ordinary skill in the art, with the benefit of this disclosure, would recognize the extension of such approach to other systems and the ability to utilize the formula disclosed hereinabove to form other crystals having similar or analogous properties. For example, a monolithic crystal comprising the atomic formula $K_3V_5O_{14}$. In alternative configurations, formulations, and various embodiments of the present disclosure, in the general atomic formula $W_nX_mY_pZ_r$, the atom W may be any chosen from the group consisting of Li, Na, K, Rb, Cs, Mg, Ca, Sr, Ba, other alkali metals, or other alkaline earth metals. Likewise, the atom X may substituted by any atom chosen from the group consisting of Fe, Ti, V, Cr, Mn, Co, Ni, Cu, Zn, Zr, Nb, Mo, Pd, Ag, Hg, or other transition metals. Also, in some alternate configurations the atom Y may be substituted with P, Al, Si, S, Ga, Ge, As, Se, In, Sn, Sb, Te, I, Ti, Pb, Bi, other nonmetals or other non-transition metals. Generally, Z comprises atomic oxygen, but in some configurations it may be understood to represent any oxygen containing functional group. In addition, Z could be fluoride (F), chloride (Cl), or bromide (Br). In further embodiments, the number of atoms of W, X, and Y may be altered to any formula, such that respective values n, m, p, and r may be any integer and in certain configurations, zero. Particularly, in some applications, p may be zero. Also in other applications, the r is an integer multiple of 7. In still further alternative embodiments of the present disclosure the oxygen stoichiometry can vary from about 3 to about 24, without limitation.

Still further, the method disclosed herein is configurable to grow large single or monolithic crystals of a variety of other materials, such as but not limited to hexagonal and tetragonal, tungsten-bronze materials, perovskites, and other compounds containing lone-pair cations. Further, as may be understood from the present disclosure, the methods disclosed herein are configurable for adjusting the melt ratio or crystal flux composition, the temperature, and the reactor/furnace conditions that are specific to the chemical nature of any crystal to be grown and particularly for crystals comprising the atomic formula in $W_nX_mY_pZ_r$.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . 50 percent, 51 percent, 52 percent . . . 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as "comprises", "includes", and "having" should be understood to provide support for narrower terms such as "consisting of", "consisting essentially of", and "comprised substantially of". Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present invention. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural or other details supplementary to the disclosure.

To further illustrate various illustrative embodiments of the present invention, the following examples are provided.

EXAMPLES

Example 1. Preparation and Characterization of Polycrystalline $LiFeP_2O_7$

Figure 4:
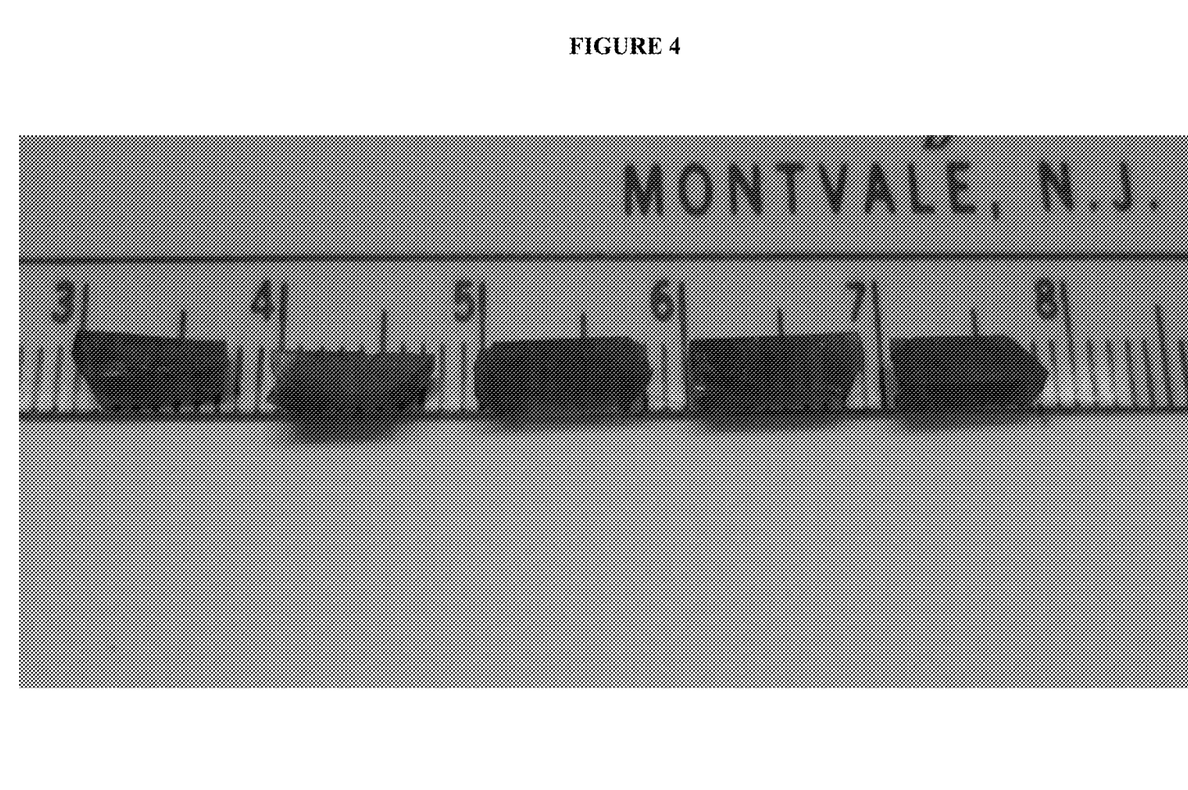
FIG. 4. illustrates seed crystals of $LiFeP_2O_7$ with at least one dimension of about 1 cm, according to another embodiment of the disclosure.

Polycrystalline $LiFeP_2O_7$ is prepared from $LiH_2PO_4$, $NH_4H_2PO_4$ and $Fe_2O_3$ by conventional solid state reactions. Stoichiometric amounts of the starting materials are thoroughly ground in an agate mortar and calcined to 750° C. in a platinum crucible for 40 hours with intermediate grindings. The purity of the resulting polycrystalline phase is determined by powder X-ray diffraction measurements using a PANalytical X'pert PRO diffractometer equipped with Cu Kα radiation ($\lambda$=1.54056 Å) in the 2θ range from 10° to 70°. The experimental X-ray diffraction pattern obtained of the synthesized polycrystalline phase of $LiFeP_2O_7$ is in perfect agreement with the calculated patterns, as shown in FIG. 4, which means that the resulting polycrystalline phase of $LiFeP_2O_7$ is very pure and consistent with the known structure and composition of $LiFeP_2O_7$. In addition, differential scanning calorimetry (DSC) measurements are performed where a 15.0 mg polycrystalline sample of $LiFeP_2O_7$ is placed in a platinum pan and heated or cooled at a rate of 10° C. min$^{-1}$ between 20° C. and 1100°

Figure 5:
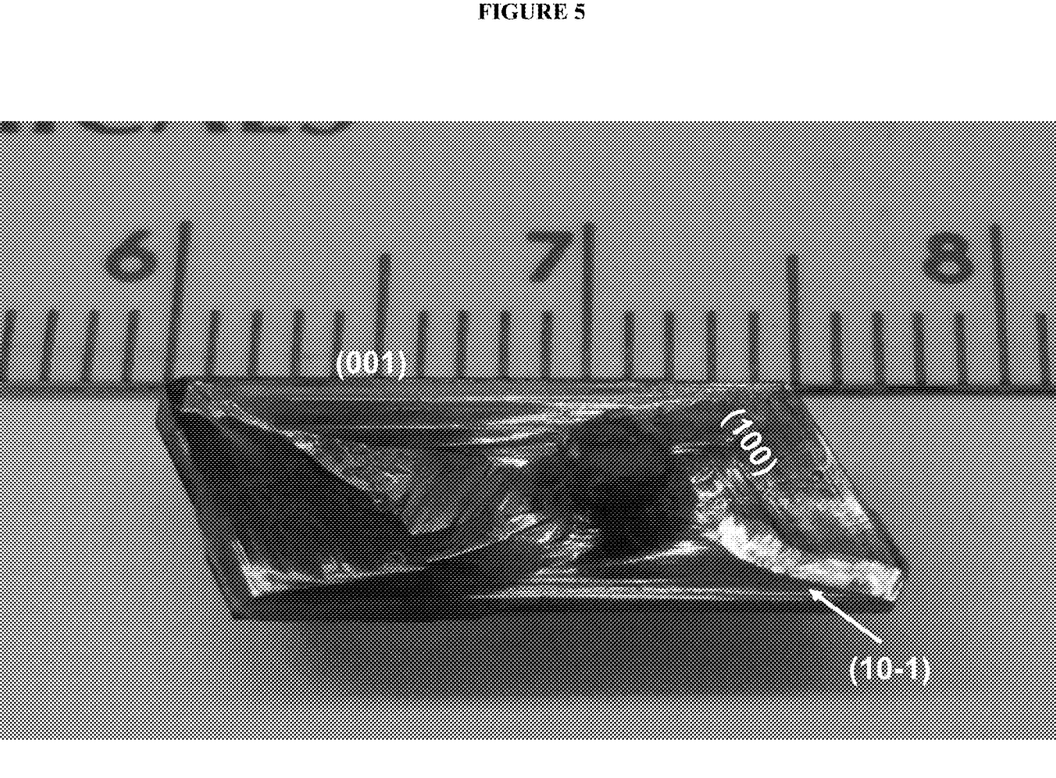
FIG. 5. illustrates an exemplary monolithic crystal of $LiFeP_2O_7$ grown from a b-axis seed crystal, having indexed faces and at least one dimension of greater than about 10 mm.
Figure 7:
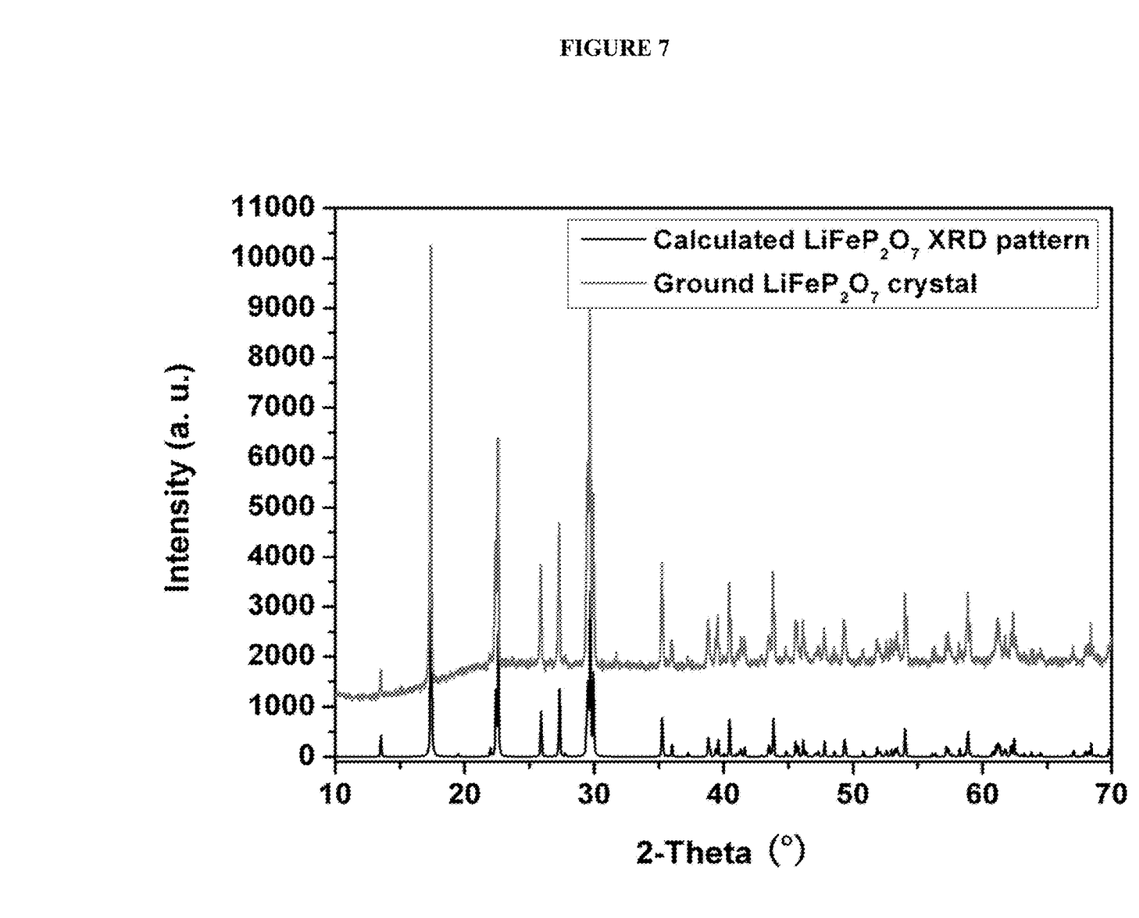
FIG. 7. graphically illustrates the calculated (black) and experimental (gray) powder X-ray diffraction pattern for polycrystalline phase of $LiFeP_2O_7$.
Figure 8:
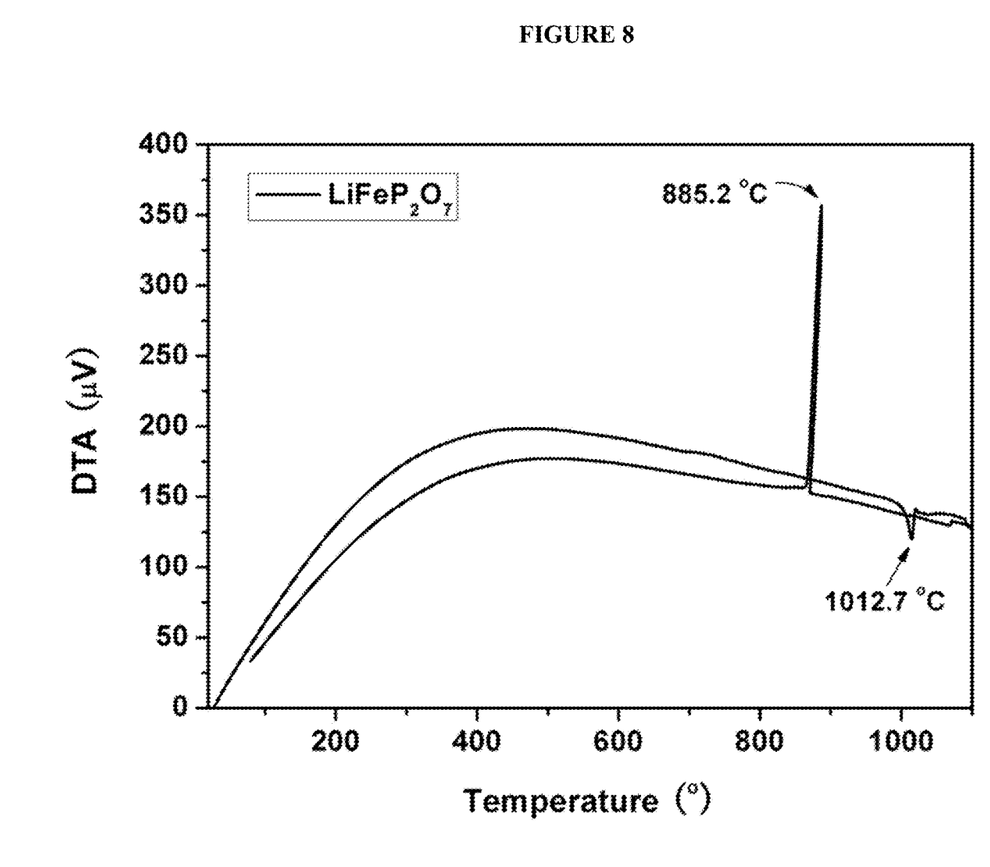
FIG. 8. graphically illustrates the differential thermal analysis data for polycrystalline phase of $LiFeP_2O_7$.
Figure 9:
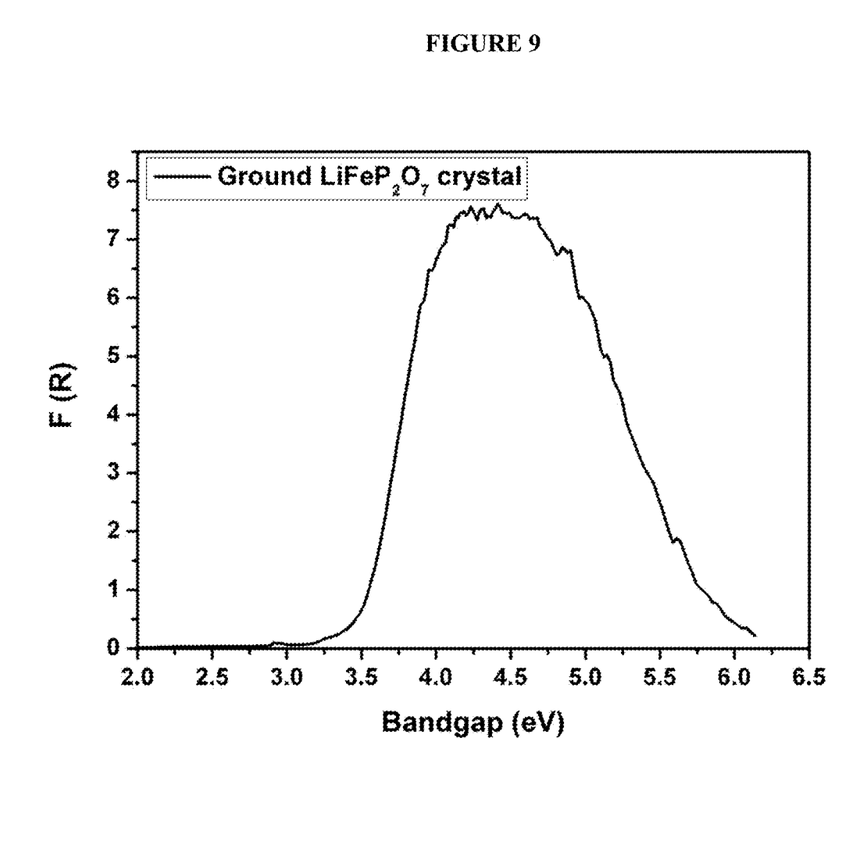
FIG. 9. graphically illustrates the diffuse reflectance data for $LiFeP_2O_7$ obtained from grinding a single crystal of $LiFeP_2O_7$ into fine powder and using Poly-tetrafluoroethylene is as a reference material.
Figure 10:
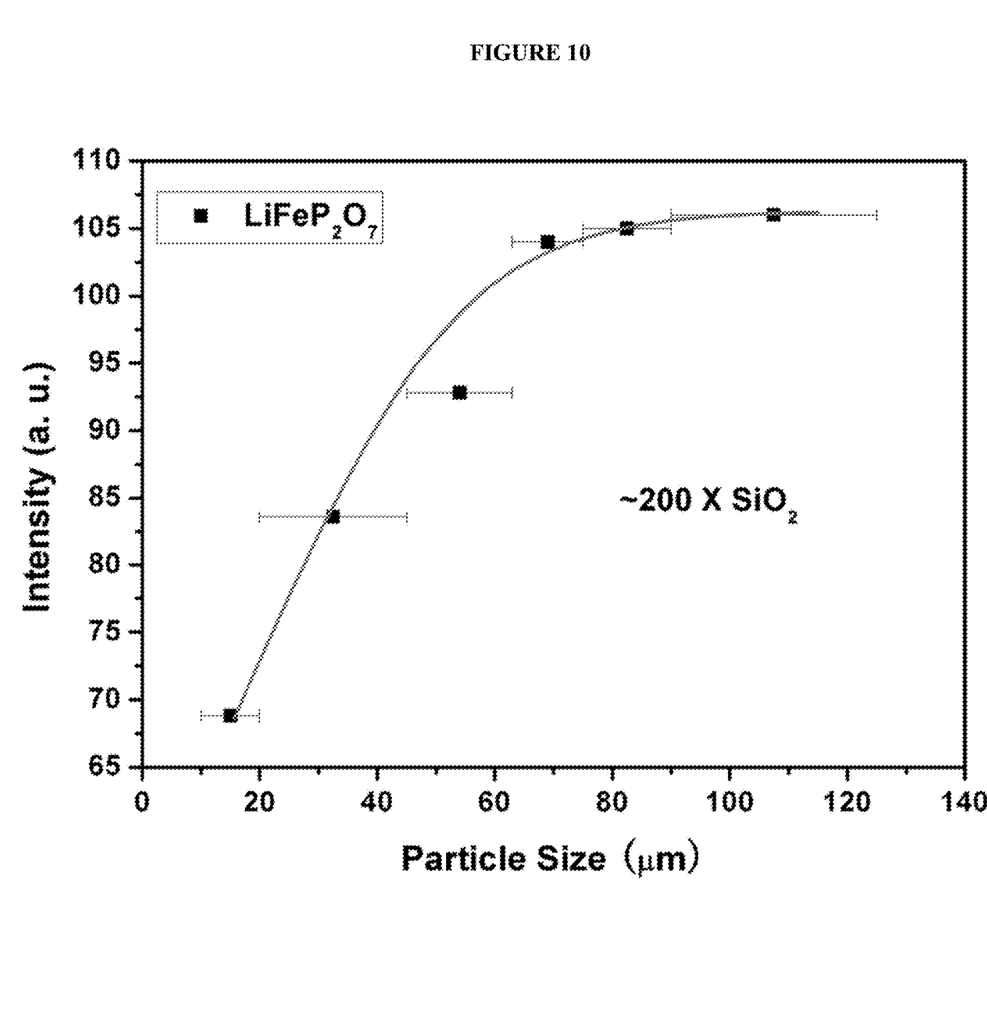
FIG. 10. graphically illustrates the powder second-harmonic generating data for the polycrystalline phase of $LiFeP_2O_7$.

C. in air. A typical calorimetric curve of polycrystalline $LiFeP_2O_7$ is exhibited in FIG. 5 and shows that $LiFeP_2O_7$ melts at 1021° C. and re-crystallizes at 885° C. Second Harmonic Generation (SHG) of powder of polycrystalline phase of $LiFeP_2O_7$ was performed at room temperature on a modified Kurtz-NLO system, using a pulsed Nd:YAG laser with a wavelength of 1064 nm. The methodology and instrumentation details have been published. As the SHG efficiency has been shown to be particle size dependent, the polycrystalline samples are ground and sieved into distinct particle size ranges (20-45, 45-63, 63-75, 75-90, and 90-120 µm). In order to evaluate relative SHG efficiencies of the measured samples (made of polycrystalline $LiFeP_2O_7$) with known SHG materials and calculate their average non-linear optical (NLO) susceptibilities, $<d_{\mathit{eff}}>_{exp}$, crystalline $\alpha$-$SiO_2$ was also ground and sieved into the same particle size ranges. No index matching fluid was used in the experiment (see FIG. 7). As seen in FIG. 7, a SHG efficiency of approximately 200×$\alpha$-$SiO_2$ is observed, showing that a strong SHG response is found for $LiFeP_2O_7$. In addition, $LiFeP_2O_7$ is type 1 phase-matchable, which means that the fundamental wavelength, 1064 nm, constructively adds with the SHG wavelength, 532 nm, as the particle size increases.

Figure 3:
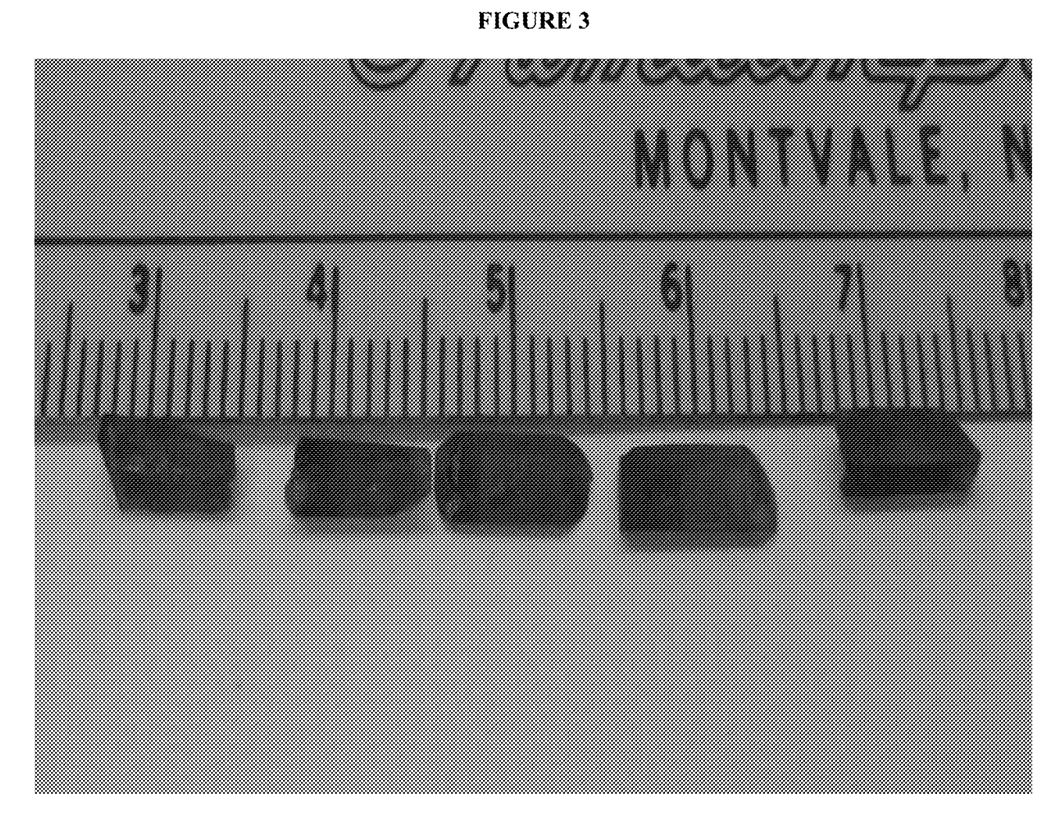
FIG. 3. illustrates seed crystals of $LiFeP_2O_7$ with at least one dimension of about 10 mm, according to an embodiment of the disclosure.
Figure 6:
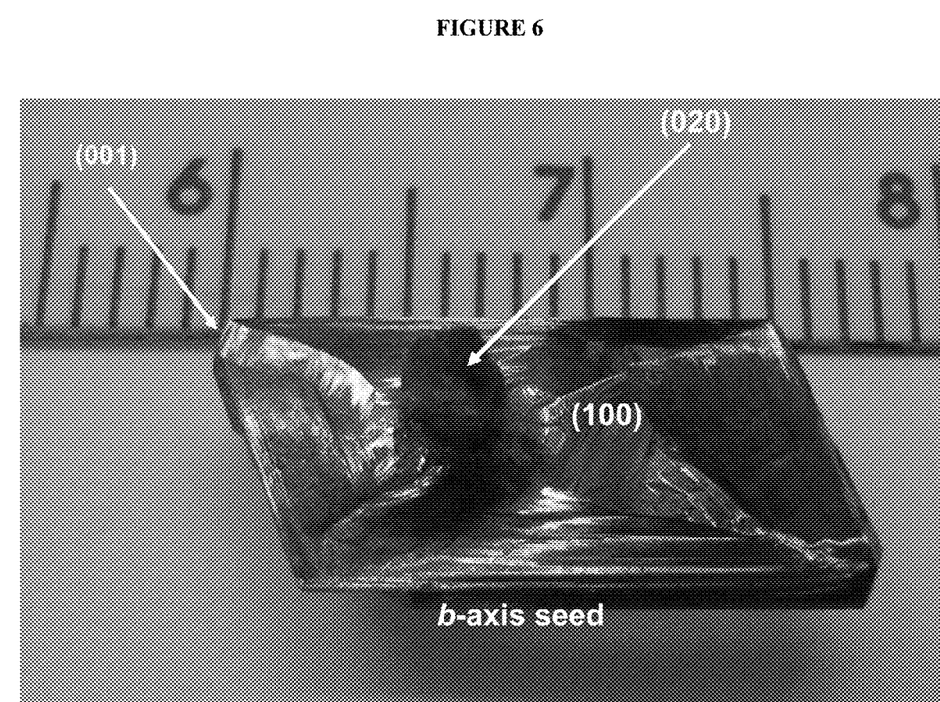
FIG. 6. illustrates another exemplary monolithic crystal of $LiFeP_2O_7$ grown from a b-axis seed crystal, having indexed faces and at least one dimension of greater than about 10 mm.

Example 2. Method for the Preparation of Growth of Single Crystals Made of $LiFeP_2O_7$ and Characterization Single crystals of $LiFeP_2O_7$ were grown by the top seeded solution growth (TSSG) method (see FIG. 1). Polycrystalline $LiFeP_2O_7$ was mixed with $LiH_2PO_4$, and $NH_4H_2PO_4$ at the molar ratio 1:0.01–0.5:0.05–0.5 to decrease to melting point of the system and compensate for the loss of phosphorous. The mixture was slowly heated to 1050° C. in a platinum crucible in a vertical furnace, in air, equipped with a Pt—Rh/Pt thermocouple, and an AI-808P controller. The temperature was held for 20 hours in order to form a homogeneous melt. The melt was cooled down 1020° C. At this time, a platinum wire was dipped into the melt and some small crystals spontaneously crystallized on the platinum wire. Some transparent small crystals were selected as seed crystals (FIG. 2) to grow large single crystals of $LiFeP_2O_7$. A b-axis oriented seed crystal was used for the large crystal growth. The process for large single crystal growth was very similar to growing the seed crystals after the saturation temperature was determined. The saturation temperature, 1040° C., was determined by seed crystal test method. At 10° C. above the saturation temperature, the seed crystal was dipped into the melt and rotated at 10 rpm. The melt was cooled down to the saturation temperature over 15 minutes. Crystal growth was allowed to proceed for 4-5 days, after which a large (centimeter size) single crystal was pulled from the melt. FIG. 3 shows a picture of a typical single crystal with a size of over 1 cm in length and with the identification of various faces such as (001), (100), (020), and (10-1) as indexed by powder X-ray diffraction, and the b-axis from the seed crystal. UV-visible reflectance data are collected on a Varian Cary 500 scan UV-vis-NIR spectrophotometer over the 200-1500 nm spectral range at room temperature. A small piece of the prepared $LiFeP_2O_7$ single crystal is ground into fine powder and poly-tetrafluoroethylene is used as a reference material. The reflectance spectrum is converted to absorbance using the Kubelka-Munk function Infrared transmission spectra are recorded on a Matteson FTIR 5000 spectrometer in the 400-4000 $cm^1$ range (FIG. 6) and shows that P—O, Fe—O, and O—P—O vibrations are present.

A major application for single crystals of $LiFeP_2O_7$ is for its use as a cathode material in lithium-ion batteries. $LiFeP_2O_7$, in addition to being a cathode material, is also crystallographically polar. That is the material exhibits a macroscopic dipole moment. Polar materials are also found in hexagonal and tetragonal tungsten bronze type materials, perovskites, and compounds containing lone-pair cations. Polar materials have a host of commercial applications including uses in burglar alarms, pollution monitors, and thermal detectors, as well as in non-volatile memories, capacitors, actuators, and non-linear optical technologies (Pockels Cell, frequency doubler). Technologically important functionalities that are observed exclusively in polar materials include pyroelectricity, ferroelectricity, and multi-ferroic behavior. Piezoelectricity and second-harmonic generation may also be observed in polar materials, however, with these phenomena polarity is not strictly required, i.e., a material may exhibit piezoelectric and second-harmonic generating phenomena without being polar. With the properties exclusive to polar materials, the pyroelectric effect may be defined as the change in the spontaneous polarization of the material as a function of temperature, whereas a ferroelectric can be formally defined as a pyroelectric material that has reversible, or 'switchable' polarization. That is, the macroscopic polarization, or dipole moment, can be reversed in the presence of an external electric field. Thus all ferroelectrics exhibit pyroelectric behavior, but the converse is not true. Pyroelectrics find uses in thermal detectors, pollution monitors, and burglar alarms, whereas ferroelectrics are used in non-volatile memories, capacitors, actuators, and non-linear optical technologies. For multi-ferroic materials, a material is considered multi-ferroic if at least two primary ferroic properties occur in the same material. The interest with multi-ferroic materials stems from their applications in information storage. Suggestions have been made that on a single multi-ferroic bit, information could be independently encoded by both polarization and magnetization.

Example 3. Method for Preparation and Characterization of Monolithic $K_3V_5O_{14}$ Crystals Bulk and polycrystalline $K_3V_5O_{14}$ were synthesized by conventional solid-state methods. Stoichiometric amounts of $KNO_3$ it was observed that several small crystals had spontaneously nucleated on the platinum wire. These small crystals were carefully extracted and confirmed to be $K_3V_5O_{14}$ by powder XRD. The exact saturation temperature was determined by observing the growth or dissolution of a seed crystal while soaking in the melt. After several growth runs with a seed crystal, a crystal of sufficient size was obtained and cut as an oriented crystal seed. In order to obtain a large and high quality single crystal, an oriented seed was introduced into the homogenous melt with a rotating rate of 10 rpm at 2° C. higher than the saturation temperature. This was followed by decreasing the temperature to the saturation point over 15 min. From the saturation temperature, the melt was cooled at a rate of 0.2° C. per day to about 1° C. below the saturation point. After 3 days growth, an as-grown single crystal was then hung above the melt surface and cooled slowly to room temperature. As-grown single crystals along [1010] and [0001] orientations were obtained using the same procedure.

Powder X-ray diffraction data were collected using a PANalytical X'Pert PRO™ diffractometer equipped with Cu-K$\alpha$ radiation (1=1.54056 Å) in the 2 h range from 10° to 70°. The experimental and calculated patterns are in good agreement. Thermogravimetric and differential thermal analyses (TG/DTA) of $K_3V_5O_{14}$ were performed on an EXSTAR TG/DTA 6300 thermal analysis system (SII Nano Technology Inc.). 11.94 mg of pure and polycrystalline $K_3V_5O_{14}$ was placed in a platinum pan and heated/cooled at the rate of 10 uC min21 in the temperature range between 25° C. and 500° C. under N2 atmosphere.

UV-visible reflectance data were collected on a Perkin-Elmer LAMBDA 1050 scan UV-vis-NIR spectrophotometer over the 200-2000 nm spectral range at room temperature. A piece of single crystal was ground into fine powder and polytetrafluoroethylene was used as a reference material. The reflectance spectrum was converted to absorbance using the Kubelka-Munk function. Infrared transmission spectra were recorded on a Matteson FTIR 5000 spectrometer in the 400-4000 $cm^{-1}$ range perpendicular to the (0001) wafer.

Second harmonic generation (SHG) and powder SHG measurements were performed on a modified Kurtz-NLO system using a pulse Nd:YAG laser with a wavelength of 1064 nm. A detailed description of the equipment and methodology has been published elsewhere. As the powder SHG efficiency has been shown to depend strongly on particle size, the reported materials were ground and sieved into distinct particle size ranges (<20, 20-45, 45-63, 63-75, 75-90, 90-120 mm). Relevant comparisons with known SHG materials were made by grinding and sieving crystalline $\alpha$-$SiO_2$ into the same particle size ranges. No index matching fluid was used in any of the experiments.

Direct piezoelectric coefficients were collected on YE2730A d33 meter (APC international, Ltd.). According to the IEEE standard, a Z-cut sample—faces perpendicular to c-axis—was cut from a $K_3V_5O_{14}$ single crystal with the size of 4.0 mm (width)×5.0 mm (length)×0.5 mm (thickness). In addition, converse piezoelectric measurements were performed using a Radiant Technologies RT66A piezoelectric test system with a TREK (model 609E-6) high-voltage amplifier, Precision Materials Analyzer, Precision High-Voltage Interface, and MTI 2000 Fotonic Sensor. For converse piezoelectric measurements, the sample was covered by silver paste on both sides as electrodes and cured at 350° C. for 5 h. The applied voltages for the Z-cut sample were set to 300, 500 and 800 V, respectively, to get a precise average value.

The Z-cut crystal used in the piezoelectric measurements was also used in the polarization measurements. The polarization was measured on a Radiant Technologies RT66A Ferroelectric and 160° C. in 20° C. increments in a Delta 9023 environmental test chamber. The temperature was allowed to stabilize before the polarization was measured. The unclamped pyroelectric coefficient, defined as dP/dT (change in the polarization with respect to the change in temperature), was determined by measuring the polarization as a function of temperature. To determine any ferroelectric behavior, the polarization loop was measured at room temperature under a static electric field of 16 kV $cm^{-1}$ from 100-1000 Hz.

Even though $K_3V_5O_{14}$ does melt congruently, a slight excess of $V_2O_5$ is needed, $K_3V_5O_{14}$:$V_2O_5$=1:0.1 molar ratio, to compensate for the vanadium loss at elevated temperatures during the crystal growth process. Well-shaped dark red single crystals of $K_3V_5O_{14}$ were grown by the TSSG method using seeds oriented along the [10$1^-$0] and [0001] directions. The as-grown crystals and simulated morphologies were indexed (hkil) planes. The crystal grown using the oriented seed has a very regular shape and shows nearly ideal hexagonal symmetry enclosed by faces (10$1^-$0), (01$1^-$0), ($1^-$100), ($1^-$010), (01$1^-$0), and (1$1^-$00). However, when using the [10$1^-$0] oriented seed, we can only index two opposite faces (0001) and (000$1^-$). Other faces are too small and rough to index. XRD data for indexed faces are deposited in electronic supplementary information (ESI). It is clear that using a seed along a high symmetry direction, i.e., along the [0001], we can obtain an excellent crystal that reveals its symmetric morphologies. Also in using the TSSG method, we did not have any twin-growth problems that often occur during solution growth. Thus, we have grown centimeter-size crystals of the noncentrosymmetric and polar material $K_3V_5O_{14}$ through a top-seeded solution growth method. The crystals were grown using seeds oriented along the [10$1^-$0], and [0001] directions. The highest quality crystals were grown using the [0001] oriented seed.

The discussion of a reference in the Description of the Related Art is not an admission that it is prior art to the present invention, especially any reference that may have a publication date after the priority date of this application. The disclosures of all patents, patent applications, and publications cited herein are hereby incorporated herein by reference in their entirety, to the extent that they provide exemplary, procedural, or other details supplementary to those set forth herein.

What is claimed is:

1. A method of producing a monolithic crystal by top-seeded solution growth, comprising:
    forming a crystal flux, wherein forming the crystal flux comprises preparing a mixture of solid precursors, wherein the precursors comprise $LiH_2PO_4$, $NH_4H_2PO_4$ and $Fe_2O_3$;
    forming, via spontaneous crystallization, a seed crystal; and
    forming a monolithic crystal by inserting the seed crystal into the crystal flux in a temperature-controlled furnace, wherein at least one dimension of the monolithic crystal is at least 10 mm.

2. The method of claim 1, further comprising:
    mechanically reducing the solid precursors; and
    analyzing the purity of the solid precursors.

3. The method of claim 1, wherein heating the precursors comprises maintaining a liquid crystal flux by controlling the temperature of the precursors within a predetermined range of a critical temperature of the precursors.

4. The method of claim 3, wherein the critical temperature is one of a saturation temperature or a melting temperature of the precursors.

5. The method of claim 1, further comprising:
    forming the seed crystal by lowering a temperature of the crystal flux from a first temperature to a second temperature;
    seeding initial crystals;
    collecting the initial crystals; and
    forming primary seed crystals.

6. The method of claim 5, wherein cooling the temperature of the crystal flux further comprises controlling the temperature within a predetermined range of a critical temperature of the crystal flux.

7. The method of claim 5, wherein the seeding comprises inserting a seed material into the crystal flux; and
    forming an initial plurality of crystals by controlling the temperature of the crystal flux within a predetermined range of a critical temperature of the crystal flux; and
    wherein the collecting the initial crystals comprises withdrawing the seed material from the crystal flux, wherein the seed material comprises a Group VIII transition metal wire.

8. The method of claim 5, wherein forming the monolithic crystal further comprises:
  seeding the initial crystal into a crystal flux at a temperature within a predetermined range of a critical temperature of the crystal flux;
  rotating the initial crystal in the crystal flux to form a primary crystal;
  collecting the primary crystal from the crystal flux; and
  processing the primary crystal to form a monolithic crystal.

9. The method of claim 8, wherein forming primary seed crystals further comprises
  cutting the initial crystal;
  re-seeding the initial crystal into the crystal flux under controlled temperatures;
  growing the initial crystal until at least one dimension is at least 5 mm;
  withdrawing the initial crystal from the crystal flux; and
  subsequent to withdrawal, mechanically or chemically altering the initial crystal.

10. The method of claim 8, wherein seeding the initial crystal further comprises coupling the initial crystal to a seed material.

11. The method of claim 8, wherein rotating the initial crystal comprises controlling the rotational frequency of the initial crystal in the crystal flux to control the shape of the primary crystal.

12. The method of claim 8, wherein processing the primary crystal comprises mechanically or chemically altering the monolithic crystal.

13. The method of claim 1, wherein controlling the temperature of the furnace further comprises controlling the temperature within a predetermined range of a melting temperature of the crystal or a saturation temperature of the crystal.

14. The method of claim 1, wherein preparing the mixture of precursors comprises mixing precursors of $LiFeP_2O_7$ and $LiH_2PO_4$ at a molar ratio of $LiFeP_2O_7$: $LiH_2PO_4$ of 1:X, wherein X is from 0.01 mole to about 0.5 mole.

15. The method of claim 1, wherein preparing the mixture of precursors comprises mixing precursors of $LiFeP_2O_7$ and $NH_4H_2PO_4$ at a molar ratio of $LiFeP_2O_7$:$NH_4H_2PO_4$ of 1:Y, wherein Y is from 0.05 mole to about 0.5 mole.

* * * * *